(12) United States Patent
Lin

(10) Patent No.: US 9,252,753 B2
(45) Date of Patent: Feb. 2, 2016

(54) QUADRATURE OUTPUT RING OSCILLATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/324,475

(22) Filed: Jul. 7, 2014

(65) Prior Publication Data

US 2016/0006420 A1   Jan. 7, 2016

(51) Int. Cl.
*H03K 3/03* (2006.01)

(52) U.S. Cl.
CPC .................. *H03K 3/0315* (2013.01)

(58) Field of Classification Search
CPC ........................ H03L 7/0995; H03K 3/0315
USPC ............................................................ 331/57
See application file for complete search history.

(56) References Cited

U.S. PATENT DOCUMENTS

| | | | | |
|---|---|---|---|---|
| 8,749,289 | B2* | 6/2014 | Li et al. | 327/291 |
| 2002/0041215 | A1* | 4/2002 | Kiyose | 331/57 |
| 2014/0240053 | A1* | 8/2014 | Huang et al. | 331/34 |

OTHER PUBLICATIONS

Sun, et al.: "A Quadrature Output Voltage Controlled Ring Oscillator Based on Three-Stage Sub-feedback Loops"; Department of Electronics, Carleton University, Ottawa, ON, Canada; Authorized licensed use limited to: Carleton University. Downloaded on Jul. 13, 2009 at 14:31 from IEEE Xplore; pp. II-176-II-179.

Grozing, et al.: "CMOS Ring Oscillator with Quadrature Outputs and 100 MHz to 3.5 GHz Tuning Range"; 29th European Solid-State Circuits Conference 2003 (ESSCIRC 2003), Estoril, Portugal, Sep. 16-18, 2003.

* cited by examiner

*Primary Examiner* — Jeffrey Shin
(74) *Attorney, Agent, or Firm* — McClure, Qualey & Rodack, LLP

(57) ABSTRACT

Various circuits are described, which sustain an oscillation using a combination of four primary inverters, four feedforward inverters, and four coupling resistors for outputting a quadrature output signal while avoiding contention between a primary inverter and a feedforward inverter. In one configuration, a circuit includes four primary inverters configured in a ring topology, four coupling resistors uniformly interposed in the ring among the four primary inverters, and four feedforward inverters forming four sub-feedback loops, respectively, each sub-feedback loop comprising two primary inverters, one coupling resistor, and one feedforward inverter. In a further embodiment, the circuit further comprises a voltage-to-current converter is for receiving a control voltage and outputting a supply current to the four primary inverters and the four feedforward inverters. A corresponding method is also provided.

6 Claims, 5 Drawing Sheets

QUADRATURE OUTPUT RING OSCILLATOR AND METHOD THEREOF

BACKGROUND OF THE INVENTION

1. Field of the Invention

The present invention generally relates to circuits and more particularly relates to ring oscillator circuits.

2. Description of Related Art

Persons of ordinary skill in the art will understand terms used in this disclosure, such as MOS (metal-oxide semiconductor) transistor, including NMOS (n-channel metal-oxide semiconductor) transistor and PMOS (p-channel metal-oxide semiconductor), "gate," "source," "drain," "saturation region," as used in connection with a MOS transistor, and basic concepts for electronic circuits, such as: "voltage," "current," "inverter," "oscillation," "frequency," "period," "phase," and "hysteresis." Terms and basic concepts like these are apparent from prior art documents, e.g. text book such as "Design of Analog CMOS Integrated Circuits" by Behzad Razavi, McGraw-Hill (ISBN 0-07-118839-8), which reflect the understanding of persons skilled in the art, and thus will not be explained in detail here.

As depicted in FIG. 1A, a prior art quadrature output ring oscillator 100 comprises four primary inverters 110, 120, 130, and 140 configured in a four-stage ring topology, and four feedforward inverters 150, 160, 170, and 180 configured to provide four feedforward paths, which operate to sustain an oscillation of an output signal comprising four phases: V0, V90, V180, and V270. This principle of the quadrature output ring oscillator 100 is known in prior art, and need not be described further herein.

An exemplary timing diagram for the quadrature output ring oscillator 100 is depicted in FIG. 1B. Here, T is a period of the output signal that comprises the four phases (V0, V90, V180, and V270). As shown in FIG. 1B, V90 leads V0 in timing by 90 degrees; V180 leads V90 in timing by 90 degrees; and V270 leads V180 in timing by 90 degrees. Note that a time delay of T/4 corresponds to 90-degree phase shift for the output signal.

In the quadrature output ring oscillator 100 of FIG. 1A, feedforward inverters 150 and 160 form a first positive feedback loop to force V0 and V180 to have opposite levels and thus opposite phases, while feedforward inverters 170 and 180 form a second positive feedback loop to force V90 and V270 to have opposite levels and thus opposite phases. However, a regenerative nature of the two positive feedback loops also introduces hysteresis that adversely impedes toggling of the output signal and thus slows down the oscillation. In addition, each primary inverter shares a common output node with a feedforward inverter, but the input of the primary inverter is different from that of the feedforward inverter and a condition of contention may occur. For instance, primary inverter 110 shares a common output $V_0$ with feedforward inverter 150, but the input of primary inverter 110 (i.e., $V_{270}$) is different from the input of feedforward inverter 150 (i.e., $V_{180}$). As shown in FIG. 1B, $V_{180}$ and $V_{270}$ are opposite in level and thus contending in time interval 101 (where $V_{180}$ is low but $V_{270}$ is high) and time interval 102 (where $V_{180}$ is high but $V_{270}$ is low). The contention not only slows down the oscillation, but also wastes power.

BRIEF SUMMARY OF THIS INVENTION

An objective of this present invention is to sustain an oscillation. This objective is accomplished using a combination of four primary inverters, four feedforward inverters, and four coupling resistors for outputting a quadrature output signal while avoiding contention between a primary inverter and a feedforward inverter.

In an embodiment, a circuit comprises: four primary inverters configured in a ring topology; four coupling resistors in the ring, wherein a resistor is interposed between each successively interposed between each of the four primary inverters; and four feedforward inverters forming four sub-feedback loops, respectively, each sub-feedback loop comprising two primary inverters, one coupling resistor, and one feedforward inverter. In a further embodiment, the circuit further comprises a voltage-to-current converter for receiving a control voltage and outputting a supply current to the four primary inverters and the four feedforward inverters.

In another embodiment, a circuit comprises: four primary inverters comprising a first primary inverter outputting a zero-degree phase of an output signal, a second primary inverter outputting a ninety-degree phase of the output signal, a third primary inverter outputting a one-hundred-eighty-degree phase of the output signal, and a fourth primary inverter outputting a two-hundred-seventy-degree phase of the output signal; four resistors comprising a first resistor coupling the zero-degree phase of the output signal to an input of the second primary inverter, a second resistor coupling the ninety-degree phase of the output signal to an input of the third primary inverter, a third resistor coupling the one-hundred-eighty-degree phase of the output signal to an input of the fourth primary inverter, and a fourth resistor coupling the two-hundred-seventy-degree phase of the output signal to an input of the first primary inverter; and four feedforward inverters comprising a first feedforward inverter receiving the one-hundred-eighty-degree phase of the output signal and providing an output to the input of the second primary inverter, a second feedforward inverter receiving the zero-degree phase of the output signal and providing an output to the input of the fourth primary inverter, a third feedforward inverter receiving the two-hundred-seventy-degree phase of the output signal and providing an output to the input of the third primary inverter, and a fourth feedforward inverter receiving the ninety-degree phase of the output signal and providing an output to the input of the first primary inverter. In a further embodiment, the circuit further comprises a voltage-to-current converter for receiving a control voltage and outputting a supply current to the four primary inverters and the four feedforward inverters.

In another embodiment, a method comprises: cascading four primary inverters in a ring topology; uniformly interposing four coupling resistors among the four primary inverters in the ring; and inserting four feedforward inverters to the ring to form four three-inverter sub-feedback loops, each comprising two primary inverters, one coupling resistor, and one feedforward inverter. In a further embodiment, the method further comprises: using a voltage-to-current converter receiving a control voltage and outputting a supply current to the four primary inverters and the four feedforward inverters.

DETAILED DESCRIPTION OF THE DRAWINGS

DETAILED DESCRIPTION OF THIS INVENTION

The present invention relates to ring oscillator. While the specification describes several example embodiments of the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
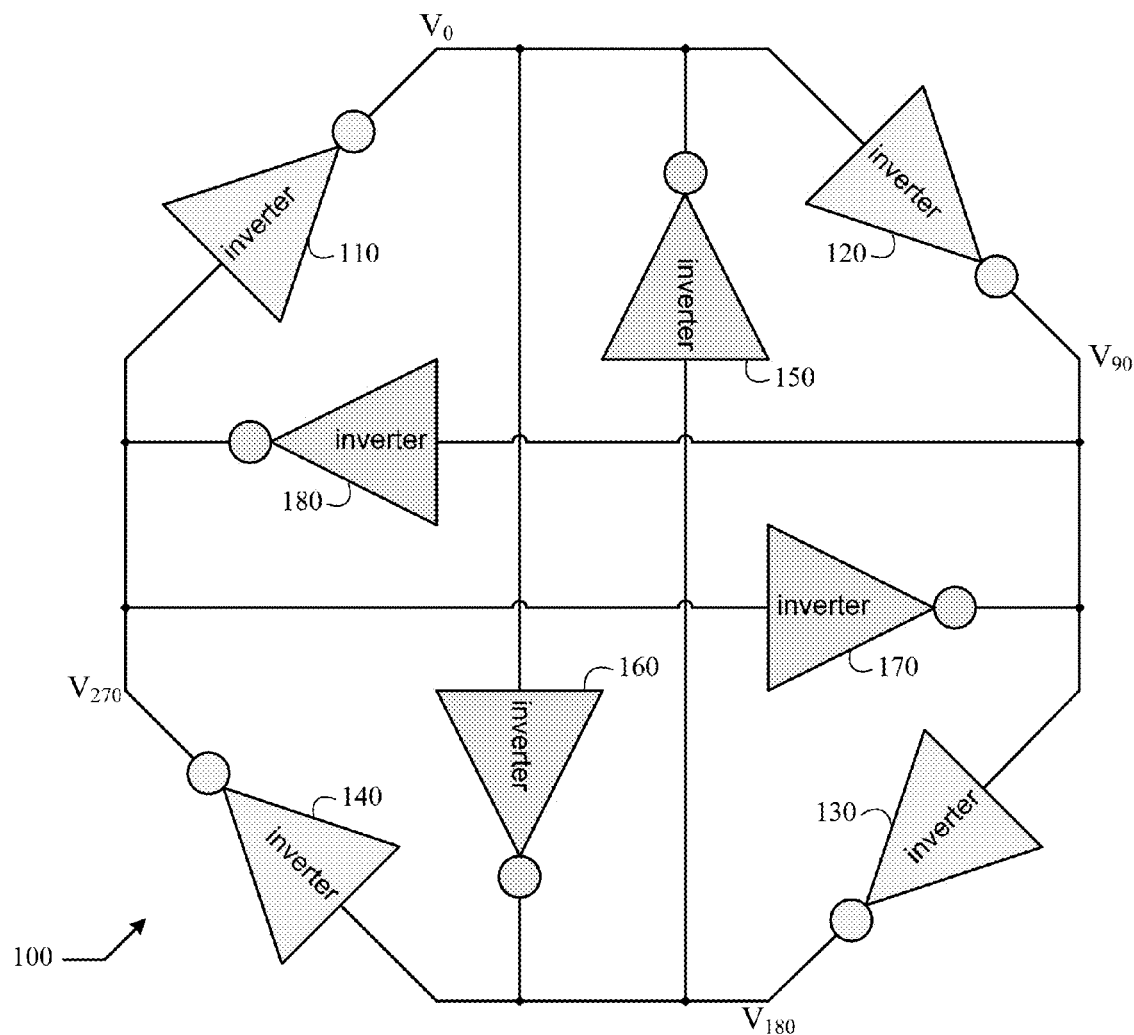
FIG. 1A shows a schematic diagram of a prior art quadrature output ring oscillator.
Figure 1B:
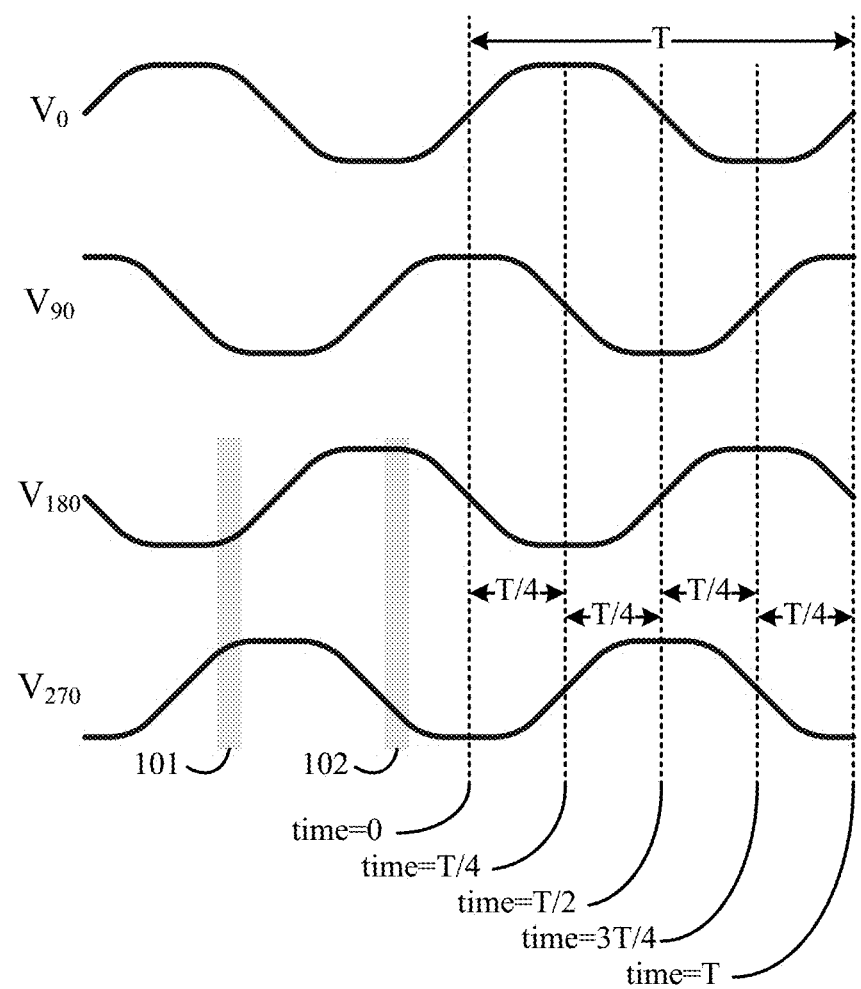
FIG. 1B shows an exemplary timing diagram for the quadrature output ring oscillator of FIG. 1A.
Figure 2A:
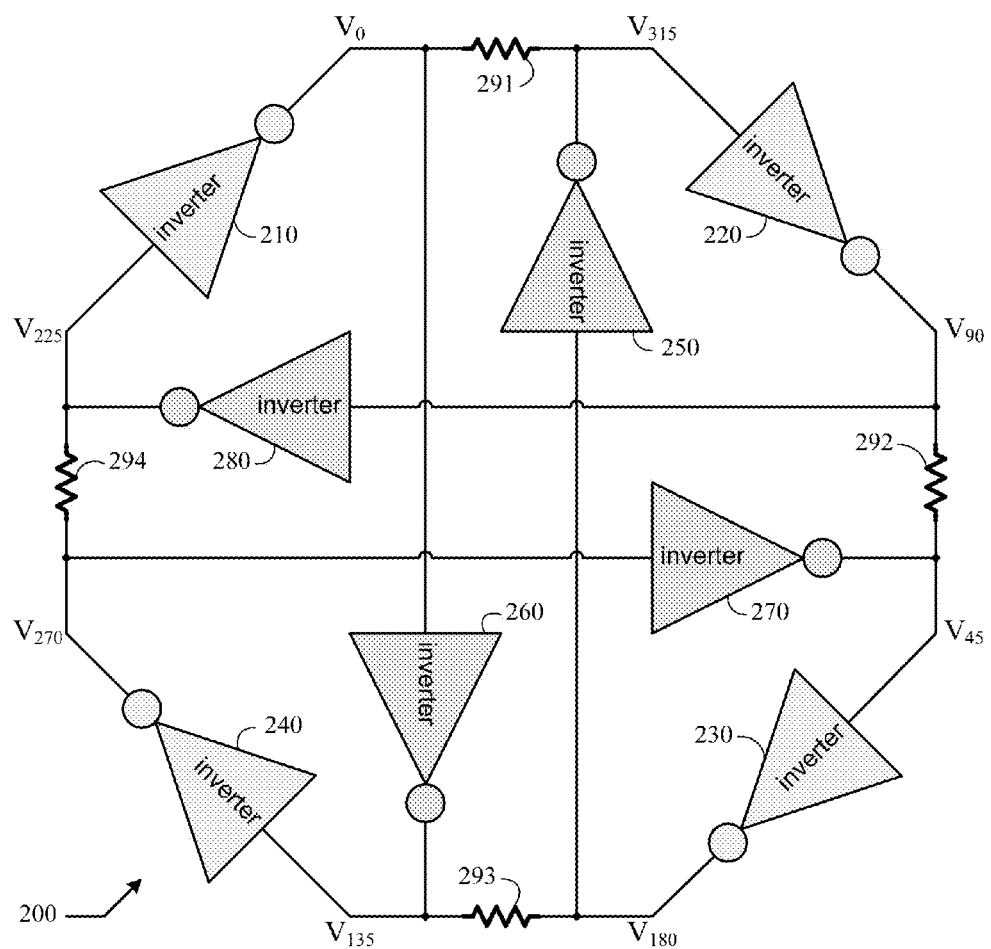
FIG. 2A shows a schematic diagram of a quadrature output ring oscillator in accordance with an embodiment of the present invention.

As depicted in FIG. 2A, a quadrature output ring oscillator 200 in accordance with an embodiment of the present invention comprises: four primary inverters comprising a first primary inverter 210 receiving an input voltage V225 and outputting a zero-degree phase (denoted as V0) of an output voltage, a second primary inverter 220 receiving an input voltage V315 and outputting a ninety-degree phase (denoted as V90) of the output voltage, a third primary inverter 230 receiving an input voltage V45 and outputting a one-hundred-eighty-degree phase (denoted as V180) of the output voltage, and a fourth primary inverter 240 receiving an input voltage V135 and outputting a two-hundred-seventy-degree phase (denoted as V270) of the output voltage. Four coupling resistors comprising a first coupling resistor 291 coupling the zero-degree phase V0 from the first primary inverter 210 to the input voltage V315 of the second primary inverter 220, a second coupling resistor 292 coupling the ninety-degree phase V90 from the second primary inverter 220 to the input voltage V45 of the third primary inverter 230, a third coupling resistor 293 coupling the one-hundred-eighty-degree phase V180 from the third primary inverter 230 to the input voltage V135 of the fourth primary inverter 240, and a fourth coupling resistor 294 coupling the two-hundred-seventy-degree phase V270 from the fourth primary inverter 240 to the input voltage V225 of the first primary inverter 210. Four feedforward inverters are also provided, comprising a first feedforward inverter 250 providing a feedforward path from the one-hundred-eighty-degree phase V180 (from the third primary inverter 230) to the input voltage V315 of the second primary inverter 220, a second feedforward inverter 260 providing a feedforward path from the zero-degree phase V0 (from the first primary inverter 210) to the input voltage V135 of the fourth primary inverter 240, a third feedforward inverter 270 providing a feedforward path from the two-hundred-seventy-degree phase V270 (from the fourth primary inverter 240) to the input voltage V45 of the third primary inverter 230, and a fourth feedforward inverter 280 providing a feedforward path from the ninety-degree phase V90 (from the second primary inverter 220) to the input voltage V225 of the first primary inverter 210. Quadrature output ring oscillator 200 of FIG. 2A differs from prior art quadrature ring oscillator 100 of FIG. 1A in that, the four coupling resistors 291, 292, 293, and 294 are uniformly interposed among the four primary inverters. As a result, a primary inverter no longer shares a common output with a feedforward inverter, and therefore the condition of contention in the prior art quadrature output ring oscillator 100 is avoided. In addition, the aforementioned problem of hysteresis in the prior art quadrature output ring oscillator 100 of FIG. 1A is also alleviated, because the regenerative nature of the two positive feedback loops (one involving feedback inverters 250 and 260 and the other involving feedback inverters 270 and 280) is mitigated due to the insertion of the four coupling resistors 291, 292, 293, and 294. Although the insertion of the four coupling resistors also introduces a delay to the output signal and slows down the oscillation, the delay can be smaller than what the hysteresis will otherwise cause, as long as a value of a resistance of the four coupling resistors is properly chosen. In an embodiment, the value of the resistance of the four coupling resistors 291, 292, 293, and 294 is chosen such that the four coupling resistors causes a phase shift of 45 degrees, or equivalently a time delay of one eighth of period, to the output signal.

Figure 2B:
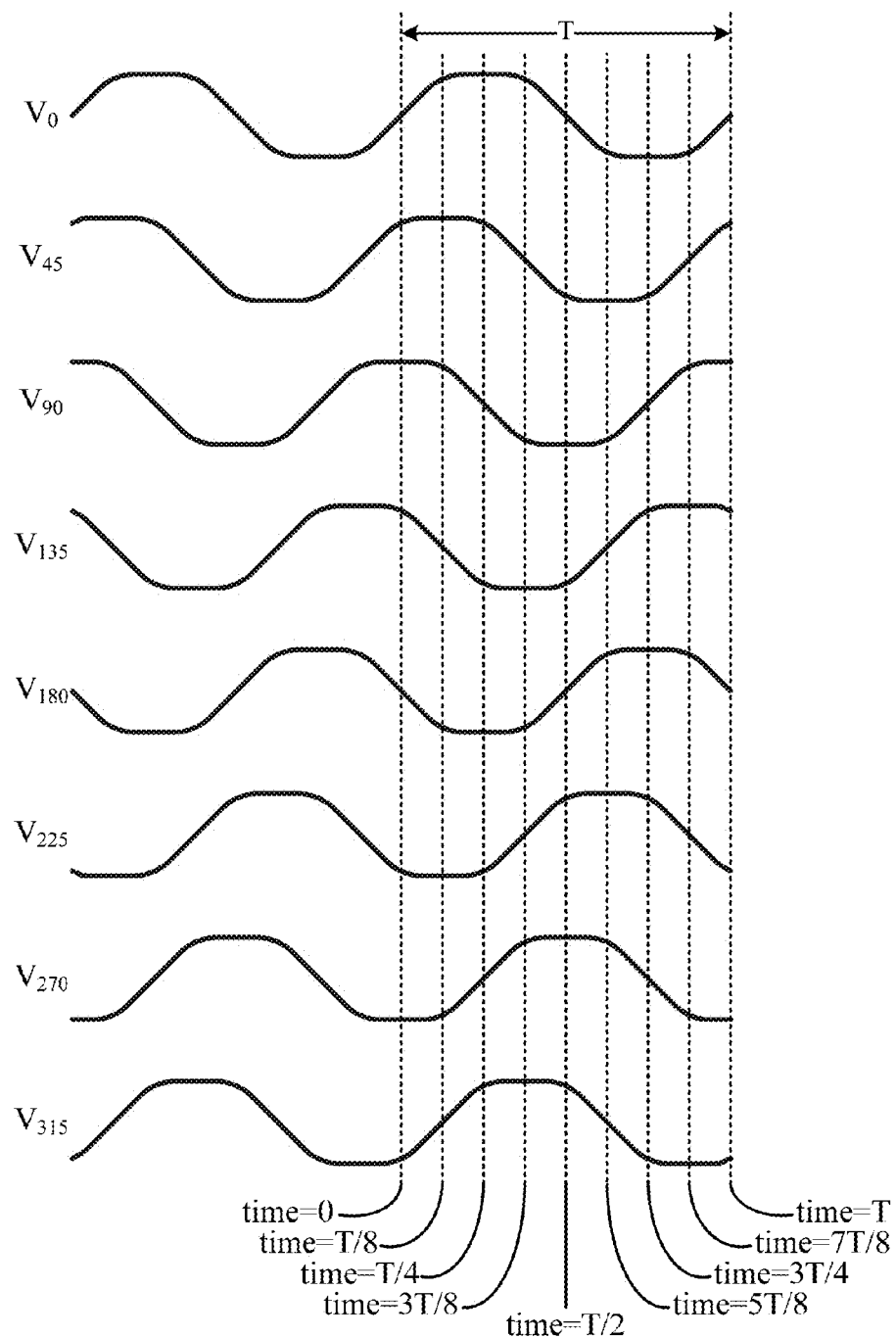
FIG. 2B shows an exemplary timing diagram for the quadrature output ring oscillator of FIG. 2A.

An exemplary timing diagram is shown in FIG. 2B. Here, T is a period of the output signal. Due to the coupling resistor 292, for instance, there is 45 degrees phase shift, or equivalently T/8 delay, between V90 and V45. Likewise, due to the coupling resistor 293, there is 45 degrees phase shift, or equivalently T/8 delay, between V180 and V135.

Note that quadrature output ring oscillator 200 comprises four three-inverter sub-feedback loops, each comprising two primary inverters, one coupling resistor, and one feedforward inverter. To be more specific: primary inverter 210, coupling resistor 291, primary inverter 220, and feedforward inverter 280 form a first sub-feedback loop; primary inverter 220, coupling resistor 292, primary inverter 230, and feedforward inverter 250 form a second sub-feedback loop; primary inverter 230, coupling resistor 293, primary inverter 240, and feedforward inverter 270 form a third sub-feedback loop; and primary inverter 240, coupling resistor 294, primary inverter 210, and feedforward inverter 260 form a fourth sub-feedback loop.

Figure 3:
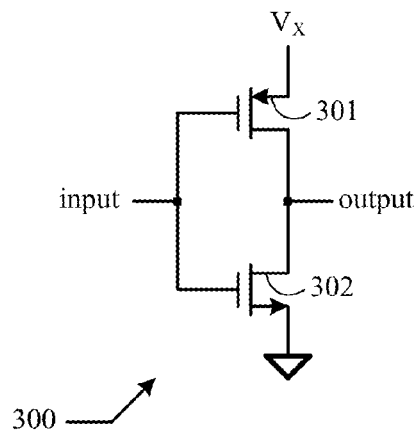
FIG. 3 shows a schematic diagram of an inverter suitable for embodying the primary inverters and the feedforward inverters of the quadrature output ring oscillator of FIG. 2A.
Figure 4:
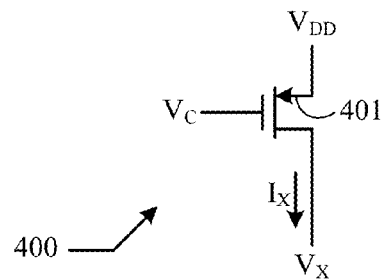
FIG. 4 shows a schematic diagram of a voltage-to-current converter suitable for generating a supply current for the primary inverters and the feedforward inverters of the quadrature output ring oscillator of FIG. 2A.

An embodiment of an inverter 300 suitable for embodying primary inverters 210, 220, 230, and 240, and feedforward inverters 250, 260, 270, and 280 of FIG. 2A is depicted in FIG. 3. Inverter 300 comprises a PMOS transistor 301 and NMOS transistor 302. Here, VX denotes a current source node from which a current is supplied to inverter 300. An embodiment of a voltage-to-current converter 400 suitable for generating a current supplied to current source node VX is depicted in FIG. 4. Here, VDD denotes a power supply voltage. Voltage-to-current converter 400 comprises a PMOS transistor 401 for receiving a control voltage VC and outputting an output current IX to the current source node VX. In one embodiment, inverters 210, 220, 230, and 240, and feedforward inverters 250, 260, 270, and 280 of FIG. 2A are embodied by inverter 300 of FIG. 3, share the same current source node VX, and receive the output current IX supplied by voltage-to-current converter 400 of FIG. 4. In this embodiment, an oscillation frequency of the quadrature output ring oscillator 200 of FIG. 2A can be controlled by the control voltage VC, wherein a lower VC leads to a higher IX and accordingly a higher oscillation frequency.

Figure 5:
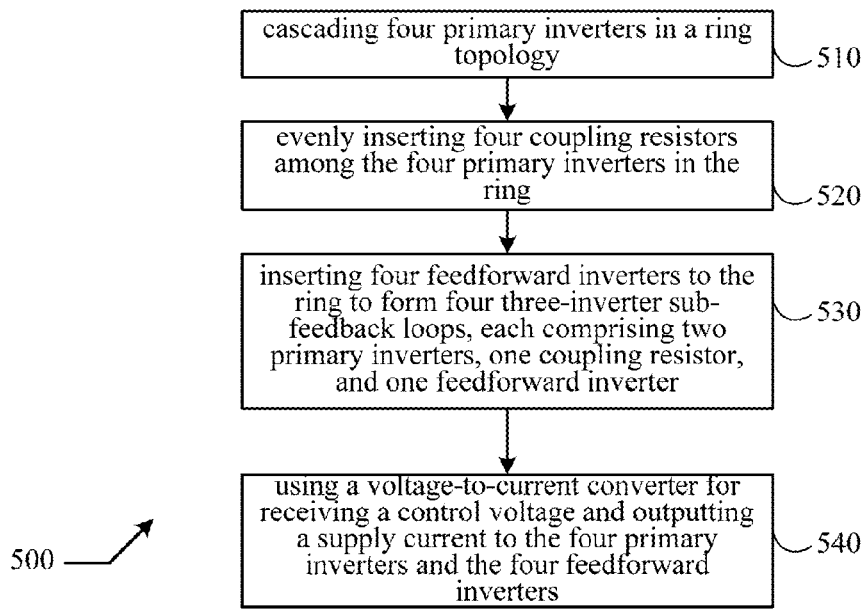
FIG. 5 shows a flow diagram of a method in accordance with an embodiment of the present invention.

In an embodiment illustrated by a flow diagram 500 shown in FIG. 5, a method comprises: step 510 cascading four primary inverters in a ring topology; step 520 uniformly interposing four coupling resistors among the four primary inverters in the ring; and step 530 inserting four feedforward inverters to the ring to form four three-inverter sub-feedback loops, each sub-feedback loop comprising two primary inverters, one coupling resistor, and one feedforward inverter. In a further embodiment, the method further comprises step 540 for using a voltage-to-current converter for receiving a control voltage and outputting a supply current to the four primary inverters and the four feedforward inverters.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   four primary inverters configured in a ring topology;
   four coupling resistors uniformly disposed in the ring among the four primary inverters, wherein a coupling resistor is interposed between each successive primary inverter; and
   four feedforward inverters forming four sub-feedback loops, respectively, each comprising two primary inverters, one coupling resistor, and one feedforward inverter, wherein each end of each of the four coupling resistors shares a connection with one of the four primary inverters and one of the four feedforward inverters.

2. The circuit of claim 1 further comprising a voltage-to-current converter receiving a control voltage and outputting a supply current to the four primary inverters and the four feedforward inverters.

3. A method comprising:
   cascading four primary inverters in a ring topology;
   evenly inserting four coupling resistors among the four primary inverters in the ring; and
   inserting four feedforward inverters to the ring to form four three-inverter sub-feedback loops, each comprising two primary inverters, one coupling resistor, and one feedforward inverter, wherein each end of each of the four coupling resistors shares a connection with one of the four primary inverters and one of the four feedforward inverters.

4. The method of claim 3 further comprising: using a voltage-to-current converter receiving a control voltage and outputting a supply current to the four primary inverters and the four feedforward inverters.

5. A circuit comprising:
   four primary inverters, including a first primary inverter outputting a zero-degree phase of an output signal, a second primary inverter outputting a ninety-degree phase of the output signal, a third primary inverter outputting a one-hundred-eighty-degree phase of the output signal, and a fourth primary inverter outputting a two-hundred-seventy-degree phase of the output signal;
   four resistors comprising a first resistor coupling the zero-degree phase of the output signal to an input of the second primary inverter, a second resistor coupling the ninety-degree phase of the output signal to an input of the third primary inverter, a third resistor coupling the one-hundred-eighty-degree phase of the output signal to an input of the fourth primary inverter, and a fourth resistor coupling the two-hundred-seventy-degree phase of the output signal to an input of the first primary inverter; and
   four feedforward inverters comprising a first feedforward inverter receiving the one-hundred-eighty-degree phase of the output signal and providing an output to the input of the second primary inverter, a second feedforward inverter receiving the zero-degree phase of the output signal and providing an output to the input of the fourth primary inverter, a third feedforward inverter receiving the two-hundred-seventy-degree phase of the output signal and providing an output to the input of the third primary inverter, and a fourth feedforward inverter receiving the ninety-degree phase of the output signal and providing an output to the input of the first primary inverter, wherein each end of each of the four coupling resistors shares a connection with one of the four primary inverters and one of the four feedforward inverters.

6. The circuit of claim 5, further comprising a voltage-to-current converter receiving a control voltage and outputting a supply current to the four primary inverters and the four feedforward inverters.

* * * * *